(12) United States Patent
Guido et al.

(10) Patent No.: US 7,070,658 B2
(45) Date of Patent: Jul. 4, 2006

(54) VAPOR DEPOSITION APPARATUS

(75) Inventors: Verreyken Guido, Edegem (BE); Bluys Peter, Ranst (BE); Hendrickx Rudy, Booischot (BE); Peeters Lucas, Hove (BE); Lamotte Johan, Rotselaar (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 10/885,512

(22) Filed: Jul. 6, 2004

(65) Prior Publication Data
US 2005/0000448 A1    Jan. 6, 2005

(30) Foreign Application Priority Data

| Jul. 4, 2003 | (EP) | ................................. 03102003 |
| Jul. 4, 2003 | (EP) | ................................. 03102004 |
| Mar. 19, 2004 | (EP) | ................................. 04101138 |

(51) Int. Cl.
C23C 14/24 (2006.01)

(52) U.S. Cl. .................. 118/718; 118/726; 392/389; 427/69

(58) Field of Classification Search ................ 118/726, 118/718; 392/389; 427/69
See application file for complete search history.

(56) References Cited

U.S. PATENT DOCUMENTS

| 2,793,609 | A | * | 5/1957 | Tzu et al. ..................... 118/726 |
| 3,446,936 | A | * | 5/1969 | Hanson et al. ............... 392/388 |
| 4,769,549 | A | | 9/1988 | Tsuchino et al. ......... 250/484.1 |
| 5,055,681 | A | | 10/1991 | Tsuchino et al. ......... 250/327.2 |
| 5,336,324 | A | | 8/1994 | Stall et al. ................... 118/719 |
| 5,532,102 | A | * | 7/1996 | Soden et al. ................ 430/128 |
| 5,803,976 | A | * | 9/1998 | Baxter et al. ............... 118/726 |
| 5,951,769 | A | * | 9/1999 | Barnard et al. ............. 118/718 |
| 6,202,591 | B1 | | 3/2001 | Witzman et al. ...... 118/723 VE |
| 6,237,529 | B1 | | 5/2001 | Spahn ........................ 118/726 |
| 2004/0224084 | A1 | * | 11/2004 | Guido et al. .................. 427/69 |

FOREIGN PATENT DOCUMENTS

| DE | 26 12424 | | 3/1976 |
| EP | 1113458 | * | 7/2001 |
| EP | 1 318 207 | | 11/2003 |
| JP | 48-97741 | | 3/1972 |
| JP | 04-154693 | * | 5/1992 |
| WO | WO 01/03156 | * | 1/2001 |

OTHER PUBLICATIONS

European Search Report, EP 03 10 2004, Dec. 9, 2003, Joffreau.
Partial European Search Report, EP 03 10 2004, Jan. 21, 2004, Brisson.
Patent Abstracts of Japan 2002 246175A (Sony Corp), Aug. 30, 2002.

(Continued)

*Primary Examiner*—Richard Bueker
(74) *Attorney, Agent, or Firm*—Joseph T. Guy; Nexsen Pruet, LLC

(57) ABSTRACT

A vapor deposition apparatus, developed in particular for on-line deposition of phosphor or scintillator material, wherein said vapor deposition apparatus comprises a crucible containing a mixture of raw materials, a chimney having at least one inlet in communication with the said crucible and a linear slot outlet, one or more lineair heating elements, contained within said chimney, an oven surrounding said crucible, wherein said oven contains heating elements, shielding elements and cooling elements.

11 Claims, 2 Drawing Sheets

OTHER PUBLICATIONS

Patent Abstracts of Japan 2000 219957A (Sharp Corp), Aug. 8, 2000.
Patent Abstracts of Japan, Publication No. 52 102681 A (Hitachi LTD), Aug. 29, 1977.
Patent Abstracts of Japan, Publiciaton No. 51 119386 A (Denki Kagaku Kogyo KK) Oct. 19, 1976.
Patent Abstracts of Japan, Publication No. 62 287065A (S N J LTD,KK) Dec. 12, 1987.

* cited by examiner

A                                              B

VAPOR DEPOSITION APPARATUS

FIELD OF THE INVENTION

The present invention relates to a vapor deposition apparatus, developed in particular for on-line deposition of phosphor or scintillator material in the manufacturing or production of scintillator or phosphor sheets, used in screens, panels or plates suitable for use in high energy radiation detection and imaging and, more particularly, in computed radiography, screen/film radiography and is direct radiography.

BACKGROUND OF THE INVENTION

In radiography the interior of objects is reproduced by means of penetrating radiation, which is high energy radiation also known as ionizing radiation belonging to the class of X-rays, γ-rays and high-energy elementary particle rays, e.g. β-rays, electron beam or neutron radiation.

For the conversion of penetrating radiation into visible light and/or ultraviolet radiation "luminescent" substances, called "phosphors", are used. Cathodoluminescent phosphors employed e.g. in CRT screens exhibit two related luminescent characteristics: fluorescence and phosphorescence. Fluorescence is the luminescent build-up or emission of light released from the phosphor during the time of electron beam excitation. Phosphorescence is the emission of light from the phosphor occurring after the cessation of electron beam excitation. The duration of phosphorescence, or rate of decay of afterglow, is denoted as persistence, usually expressed as a measurement of time required for the phosphorescence in order to reduce or decay to a ten percent level of steady state fluorescent brightness.

In known X-ray image intensifiers for example as disclosed in U.S. Pat. No. 3,838,273, the input screen comprises a substrate such as glass or aluminum on which is deposited an X-ray sensitive radiation conversion layer, commonly referred to as a fluorescence layer or scintillator.

In a conventional radiographic system an X-ray radiograph is obtained by X-rays transmitted imagewise through an object and converted into light of corresponding intensity in a so-called intensifying screen (X-ray conversion screen) wherein phosphor particles absorb the transmitted X-rays and convert them into visible light and/or ultraviolet radiation to which a photographic film is more sensitive than to the direct impact of X-rays. In practice the light emitted imagewise by said screen irradiates a contacting photographic silver halide emulsion layer film which after exposure is developed to form therein a silver image in conformity with the X-ray image.

As described e.g. in U.S. Pat. No. 3,859,527 an X-ray recording system has meanwhile been developed wherein photostimulable storage phosphors are used having, in addition to their immediate light emission (prompt emission) on X-ray irradiation, the property to store temporarily a large part of the X-ray energy. Said energy is set free by photostimulation in the form of fluorescent light different in wavelength from the light used in the photostimulation. In said X-ray recording system the light emitted on photostimulation is detected photoelectronically and transformed into sequential electrical signals. A storage screen or panel coated with such phosphors is exposed to an incident pattern-wise modulated X-ray beam and as a result thereof energy is temporarily stored in the coated storage phospors, corresponding with the X-ray radiation pattern. At some interval after the exposure, a beam of visible or infra-red light scans the panel in order to stimulate the release of stored energy as light that is detected and converted to sequential electrical signals which are processed to produce a visible image. Stimulation light can be transformed into an electric signal by making use of a photoelectric conversion element such as e.g. a photo-multiplier. It is clear that the phosphor should store as much as possible of the incident X-ray energy and emit as little as possible of the stored energy until stimulated by the scanning beam. This is called "digital radiography" or "computed radiography".

Recently, in the hospitals the tendency is increasing to obtain X-ray images on computer monitor immediately after X-ray exposure of the patient. By storing and transmitting that digitized information efficiency and speed of diagnosis is enhanced. Accordingly "direct radiography" providing directly digital diagnostic X-ray images, after exposure of an adapted detector panel in a radiographic apparatus, becomes preferred instead of the conventional screen/film system. The X-ray quanta are transformed into electric signals by making use of a solid-state flat detector as "image pick-up" element. Such a flat detector is commonly called a "flat panel detector" and is two-dimensionally arranged. Making use therein of a photoconductive material as a detecting means, such as a-Se, in which the negative electrical charge of an electron and the positive electrical charge of a hole are generated by the X-ray energy, said X-ray energy is directly converted into those separated electrical charges. The electrical charge thus obtained is read out as an electric signal by the read-out element, two-dimensionally arranged in a fine area unit.

Furtheron an indirect type flat panel detector is known, in which the X-ray energy is converted into light by a scintillator, and in which the converted light is converted into the electric charge by the photoelectric conversion element such as a-Si two-dimensionally arranged in a fine area unit. The electrical charge is read out again as an electric signal by the photoelectric conversion read-out element, two-dimensionally arranged in a fine area unit.

Moreover a direct radiography detector is known in which the X-ray energy is converted into light by a scintillator, and wherein the converted light is projected on one or more CCD or CMOS sensors which are arranged matrix-wise in the same plane, through a converging body such as a lens or optical fiber. In the inside of the CCD or CMOS sensor, via photoelectric conversion, and charge-voltage conversion, an electric signal is obtained in every pixel. This type of detector is also defined, therefore, as a solid state plane detector.

The image quality that is produced by any radiographic system using phosphor screen or panel, and more particularly, within the scope of the present invention, in a digital radiographic system, largely depends upon the construction of the phosphor screen. Generally, the thinner a phosphor screen at a given amount of absorption of X-rays, the better the image quality will be. This means that the lower the ratio of binder to phosphor of a phosphor screen, the better the image quality, attainable with that screen or panel, will be. Optimum sharpness can thus be obtained when screens without any binder are used. Such screens can be produced, e.g., by physical vapor deposition, which may be thermal vapor deposition, sputtering, electron beam deposition or other of phosphor material on a substrate. Such screens can also be produced by chemical vapor deposition. However, this production method can not be used to produce high quality screens with every arbitrary phosphor available. The mentioned production method leads to the best results when phosphor crystals with high crystal symmetry and simple chemical composition are used. So in a preferred embodiment use of alkali metal halide phosphors in storage screens or panels is well known in the art of storage phosphor radiology and the high crystal symmetry of these phosphors makes it possible to provide structured, as well as binderless screens.

It has been disclosed that when binderless screens with an alkali halide phosphor are produced it is beneficial to have the phosphor crystals deposited as some kind of piles or pillar-shaped blocks, needles, tiles, etc., in order to increase the image quality that can be obtained when using such a screen. In U.S. Pat. No. 4,769,549 it is disclosed that the image quality of a binderless phosphor screen can be improved when the phosphor layer has a block structure, shaped in fine pillars. In U.S. Pat. No. 5,055,681 a storage phosphor screen comprising an alkali halide phosphor in a pile-like structure is disclosed. In EP-A 1 113 458 a phosphor panel provided with a selected vapor deposited CsBr: Eu phosphor layer is disclosed, wherein the binderless phosphor is present as fine needles in favor of an optimized image quality.

It is clear that, from a point of view of homogeneity of layer thickness and chemical composition of the scintillator, in favor of a constant speed, image quality and diagnostic reliability, it is of utmost importance to provide said constant composition and layer thickness over the whole two-dimensional panel surface in the production of the storage phosphor plates. A homogeneous coating profile should thus be strived for.

Manufacturing procedures making use of deposition techniques as in U.S. Pat. No. 4,449,478 wherein an arrangement for coating substrates in an apparatus for vacuum deposition comprises a rotatable substrate holding structure in a form of a plate, provide coated panels limited in number and in coated surface. Moreover, when square or rectangular panels are desired, quite a lot of expensive residue is created while not being deposited onto the plate, rotating with a circular symmetry above the vapor source. In addition, when depositing material from a fixed source onto such a rotating substrate, it is difficult to obtain a layer with a constant thickness. Circles on the substrate, having the rotation axis as centre will have identical deposition history. This creates a centro-symmetric thickness profile, which means that the thickness of the deposited layer is constant along neither of the sides of a rectangular substrate, unless special precautions are taken, e.g. use of a mask which will however lead to material losses.

Manufacturing procedures making use of deposition techniques as in US-Application 2003/0024479 wherein an arrangement for coating rigid substrates, batch wise (plate per plate) in an apparatus for vacuum deposition comprises a substrate holder conveyed from a loading chamber to an unloading chamber by a conveying mechanism, provide coated panels limited in process yield. Another batch process has been described in U.S. Pat. No. 6,402,905, where commonly a vapor deposition coating process is applied by which vapor is deposited onto a substrate that rotates around one axis that is perpendicular to the deposition area, as commonly applied in the state of the art, and wherein a system and method for controlling and compensating unevenness of the deposition thickness distribution on a substrate has been described.

In such a batch process a coating failure will generally lead to the complete loss of a panel. Moreover there will always be a high loss of raw materials in such batch processes.

Lack of deformability of the substrate also limits the format of the coating of a phosphor or scintillator layer on a substrate to the largest cross section of the vacuum deposition chamber. A solution in order to provide a method for producing phosphor or scintillator plates or panels, wherein the layer thickness in the manufacturing process is constant over large surface areas, so that phosphor plates of differing tailor-made sizes are available, has been given in EP-Applications Nos. 03 100 723, filed Mar. 20, 2003 and 04 101 138, filed Mar. 20, 2004. That process was resulting in a high process yield from the same deposition process, thus providing a method for producing phosphor or scintillator plates or panels on very large flexible substrates, cutting these large areas in desired formats and protecting these flexible plates or panels against physical, chemical or mechanical damage, or a combination thereof. Although many measures have been described therein, it remains of utmost importance to have the panel free from dust or dirt, in favor of diagnostic imaging quality, more particularly when screens, plates or panels ready-for-use in a scanning apparatus in computed radiography, screen/film radiography and direct radiography of all formats are envisaged.

As has been established in EP-Application 03 102 003, filed Jul. 4, 2003 care should be taken in order to avoid "spot errors" or "pits", resulting in uneven deposit of phosphors or scintillators, due to spitting of the liquefied raw materials present in the heated container(s). Besides physical presence of an undesired unevenness at the surface, differences in speed or sensitivity may indeed lay burden on its use as a screen, plate or panel for use in diagnostic imaging, especially when those phosphors are suitable for use in direct radiography as scintillators, in intensifying screens as prompt emitting phosphors or in storage panels as stimulable phosphors, used in computed radiography (CR).

An assembly comprising two plates or covers, one of which being an outermost plate or cover, and both, at least in part having a perforation pattern over a surface area covering an open side of a crucible having a bottom and surrounding side walls containing raw materials, wherein said outermost cover is mounted at a distance farther from the said crucible than said cover covering said open side of a crucible, and wherein both covers are mounted versus each other, so that, when viewed through an axis in a direction perpendicular to the bottom of the crucible from a distance to said outermost cover of at least 10 times the distance between said two plates or covers, its contents cannot be observed, has been offered as a solution for that problem. It is however an ever lasting demand, not only to provide homogeneity in speed over the whole surface of the phosphor plate, but also to provide the highest attainable speed possible for the same coating amount of evenly distributed vapor deposited phosphor layers on a phosphor plate.

OBJECTS AND SUMMARY OF THE INVENTION

Therefore it is an object of the present invention to provide a vapor deposition apparatus, developed in order to prepare phosphor or scintillator plates, wherein said plates, prepared from large area plates, show further improved homogeneity in speed and sharpness over the whole area of the said large area plates, and wherein, irrespective of their dimensions when ready-for-use, those plates or panels are free of defects, due to dust or dirt, generated during vapor deposition and/or afterwards after cutting into plates having the desired dimensions.

Other objects will become apparent from the description hereinafter.

The above-mentioned advantageous effects have been advantageously realized by a particular vapor deposition apparatus having the specific features set out in claim 1. Specific features for preferred embodiments of the invention are set out in the dependent claims and in the drawing.

Further advantages and embodiments of the present invention will become apparent from the following description and drawings.

BRIEF DESCRIPTION OF THE DRAWINGS

Following Figure represents an illustration of the vapor deposition apparatus wherein the coating process takes place. It is clear that this Figure, showing preferred embodiments for the apparatus according to the present invention, is in no way limited thereto.

Figure 1:
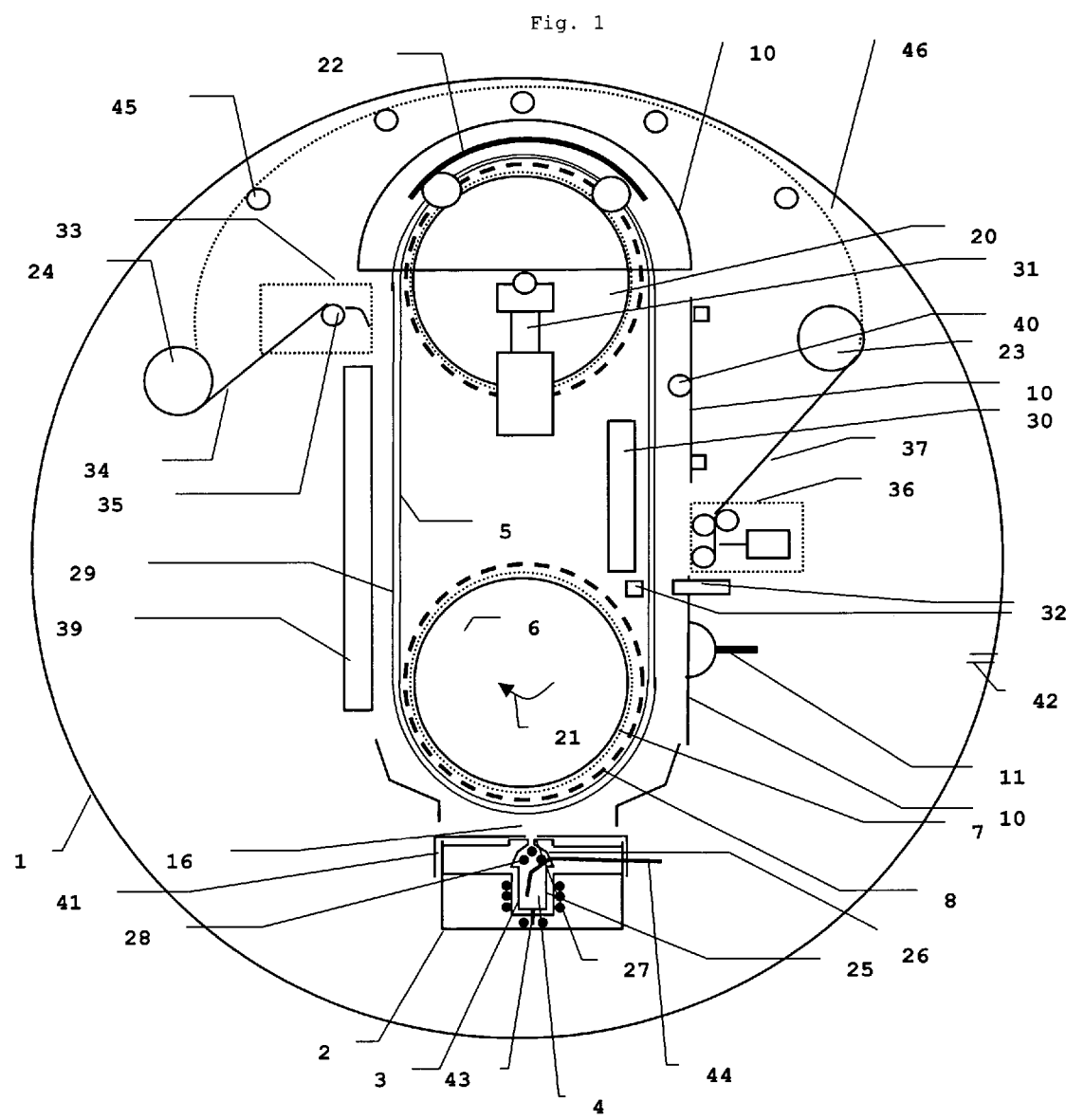
FIG. 1 is known from EP-Application No. 04 101 138, filed Mar. 19, 2004 and shows a sealed zone acting as vacuum chamber (1), a flexible sheet (5) that is stretched around two conveying rollers, roller (6) being the lower and roller (20) being the upper conveying roller, moving in a direction as indicated by the arrow (21), through a vapor stream (16), provided by the mixture of raw materials (4) present in the crucible, tray or boat (3) provided with a container (25), an internally heated chimney (26) and a controllable outlet (27), heated to provide a vapor source generating said vapor stream (16), in order to provoke a phosphor layer to be deposited onto the flexible sheet (5) passing the vapor stream in (preferably continuous) multiple successive steps, wherein the flexible sheet (5) does not leave the vacuum chamber (1) and wherein at least during said step of vapor deposition the sealed zone is maintained under vacuum conditions. It is clear that the illustration is not limitative and that many configurations are possible within the space of the vacuum chamber (1) as has already been set out in the previously filed from EP-Applications Nos. 03 100 723, dated Mar. 20, 2003 and 04 101 138, filed Mar. 19, 2004.

Particular parts present in order to reach the object of avoiding dust or dirt are the protecting foil (29) of substrate support (5) that is removed, when present on the flexible substrate support sheet (5) before vapor depositing the phosphor or scintillator layer. That protective foil is wound up and collected upon roller (24), before, optionally, applying corona discharge in order to further remove dust or dirt residues and before starting vapor deposition.

The suction table (30) acting as a means in order to position the substrate web onto the rollers, is further used to provide correct positioning of the protecting laminate foil (37) provided by unwinding roller (23) and applied via lamination unit (36) after phosphor or scintillator deposition. In a particular embodiment the laminate release foil (46) of a laminate package consisting of a laminate layer (37), a release foil (46) and an adhesive layer inbetween is guided over guiding rollers (45) and wound up over the same delamination collecting roller for the initial delaminate foil present on the substrate support sheet (5).

Particular parts present in order to reach the object of further improving homogeneity of vapor deposition are the heating systems: besides those already mentioned in order to maintain the temperature within the crucibles at a level in order to avoid condensation of scintillator or phosphor material onto the walls of the chimney (26) a heat shield (41) with a slit in order to let the vapors pass therethrough acts as another source maintaining the temperature at the high desired level.

In favor of homogeneity of deposition another important part is the reflector cage (10) avoiding loss of heat within the sealed zone: its spatial arrangement has been optimized in order to avoid further excessive measures in favor of homogeneity of deposition and reproducibility. Nevertheless another important part is the cooling unit (39) providing an "off" and an "on" position in order to have sufficient heat in the support: once the phosphor starts to deposit the cooling is switched to an "on" position as substrate temperature increases, while further decrease while cooling is compensated by switching to an "off" position as will further be explained in the examples.

Controlling and steering parts as thermocouples (43) in contact with the outside crucible wall and (tantalum) protected thermocouples inside the crucible (44) under the raw phosphor or scintillator material level and in the vicinity of the lamps.

An important controlling part is the thickness measuring system (22), determining the thickness of the vapor deposited scintillator or phosphor layer, based on capacitance measurements.

Furtheron one or more pressure regulating cylinder(s) (31) for controll and regulation of tension on the substrate support sheet (5), during the whole procedure is present.

Figure 2:
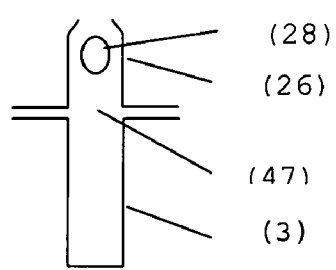
Figure 2:
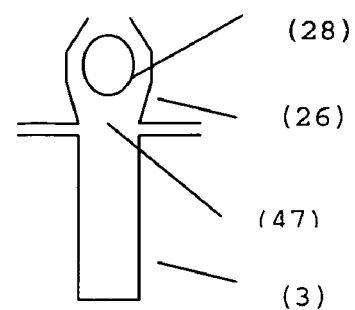

FIG. 2 shows a more detailed image of the crucible (3) with one chimney heater (28) in the chimney (26) and an inlet (47) positioned at opposite sites of the crucible, under the chimney heater (28). FIG. 2B is illustrative for an improved version of the crucible (3) as illustrated in FIG. 2A, in that the upper part of the crucible is folded and broadened.

DETAILED DESCRIPTION OF THE INVENTION

In order to reach the objects of the present invention a vapor deposition apparatus is provided, wherein said apparatus comprises a) a crucible containing a mixture of raw materials (in order to prepare vapor deposited phosphor or scintillator layers);

b) a chimney having at least one inlet in communication with the said crucible and a linear slot outlet, having a width W and a length L (for directing the vapor for directing vapor of said raw materials out of said crucible);

c) one or more linear heating elements, contained within said chimney (adapted to heat the chimney for avoiding condensation and to overcome spatter of source material against the substrate);

d) an (electrically heated) oven surrounding the crucible (for heating of the crucible) containing heating elements (for heating up the crucible containing a mixture of raw materials), shielding elements and cooling elements (in order to prevent heating of the environment).

The vapor deposition apparatus according to the present invention is in a more particular embodiment provided with a crucible and chimney, so that longitudinal parts of crucible (3) and chimney (26) form one integrated part and are made out of one piece of material in order to prevent material losses at the interface thereof.

The vapor deposition apparatus according to the present invention further has at least one linear heating element mounted in said (internally heated) chimney (26).

The vapor deposition apparatus according to the present invention further has, in a preferred embodiment, three lineair chimney heating elements (chimney heaters 28) mounted versus said slot outlet, and positioned so that there is no direct path for vaporized particles from said raw materials to escape through said slot outlet. Such an arrangement is more particularly required in order to avoid spattering and the chimney heaters are acting as baffles. In another embodiment a refractory plate, e.g. a tantalum plate, is mounted internally in the crucible under the baffling chimney heaters. Said crucible and said plate is further mounted between an electrode pair, in order to provide further homogeneous heating over the whole heat-conducting assembly, in favor of homogeneous deposition of phosphor or scintillator material.

In the vapor deposition apparatus according to the present invention said (controllable) slot outlet (27) is a rectangular slot outlet.

It is a particular advantage that in the vapor deposition apparatus according to the present invention said linear chimney heating elements (28) are movable in an upward or downward position.

In a further embodiment the vapor deposition apparatus according to the present invention comprises a heat shield (41) around said chimney. Said heat shield is further provided with a slit as illustrated in FIG. 1, in order to avoid extra heating of the carrier roller passing the zone where vapors are deposited.

The vapor deposition apparatus according to the present invention further comprises regulation means for said width W of said slot outlet (27) of said chimney (26) along its length L.

So in the vapor deposition apparatus according to the present invention said chimney slot outlet (27) has an average width W1, said chimney inlet (47) has an average width W2, and a ratio of W2/W1 is more than 3.

In another embodiment of the vapor deposition apparatus according to the present invention said chimney slot outlet (27) has an average width W1, said chimney inlet (47) has an average width W2, and a ratio of W2/W1 is more than 4.

In still another embodiment of the vapor deposition apparatus according to the present invention said chimney slot outlet (27) has an average width W1, said chimney inlet (47) has an average width W2, and a ratio of W2/W1 is more than 8.

The vapor deposition apparatus according to the present invention further has at least two cylindrical carrier rollers (6) within a sealed zone, wherein each of said carrier rollers has an axis in a parallel arrangement with one another.

The vapor deposition apparatus according to the present invention further has sheets or panels having flexible supports or substrates as a support for coating a phosphor or scintillator layer within a sealed zone, wherein said zone comprises at least two cylindrical carrier rollers for carrying a flexible substrate wherein said cylindrical carrier rollers each have an axis in a parallel arrangement with one another.

In a particular embodiment the vapor deposition apparatus according to the present invention in said zone further comprises more than one crucible containing a mixture of raw materials providing desired phosphor or scintillator compositions for said layer.

The vapor deposition apparatus according to the present invention further comprises a laminating unit.

In another embodiment the vapor deposition apparatus according to the present invention further comprises, besides a laminating unit, a delaminating unit.

The vapor deposition apparatus according to the present invention provides ability for one carrier roller to rotate, in a controlled way, by means of a motor around its axis, whereas other roller(s) is(are) rotating by movement of said one roller; wherein, while rotating, the position of the flexible substate on the rollers is controlled by means of an optical positioning sensor, coupled back to pressure regulating cylinder(s), providing position adjustment of said flexible substrate.

In the vapor deposition apparatus according to the present invention said carrier rollers are thermally isolated from said flexible substrate support by means of a thermal isolation layer and/or a plurality of heat-resistant coiled springs, mounted over the length of the cylinders in such a way that the said coiled springs make an angle in the range of 20° to 40° with a line, parallel with the axis of said cylindrical carrier rollers.

The vapor deposition apparatus according to the present invention further comprises regulable heaters and an adressable cooling unit installed along said cylindrical carrier rollers. In the vapor deposition apparatus according to the present invention said cooling unit (39) is build up of a black body cooling element, cooled with water at room temperature on the backside, and of an addressable (opened or closed) screen of louvers in form of multiple slats on the front or support side of said cooling element.

In the vapor deposition apparatus according to the present invention a set of pyrometers is mounted over the whole width of said cylindrical carrier rollers.

Furthermore in the vapor deposition apparatus according to the present invention the said cylindrical carrier rollers are spatially surrounded by a reflector cage for heat radiation.

In a preferred embodiment the vapor deposition apparatus according to the present invention is provided with raw materials, wherein said raw materials comprise, as phosphor precursors, at least $Cs_xEu_yX'_{x+\alpha y}$, wherein the ratio of x to y exceeds a value of 0.25, wherein $\alpha \geq 2$ and wherein X' is a halide selected from the group consisting of Cl, Br and I and combinations thereof.

In another preferred embodiment the vapor deposition apparatus according to the present invention is provided with raw materials, wherein said raw materials comprise, as phosphor precursors, at least CsBr and $Cs_xEu_yX'_{x+\alpha y}$, wherein the ratio of x to y exceeds a value of 0.25, wherein $\alpha \geq 2$ and wherein X' is a halide selected from the group consisting of Cl, Br and I and combinations thereof.

The photostimulable phosphor may contain a metal oxide such as aluminum oxide, silicon dioxide, and/or zirconium oxide in an amount of 0.5 mol or less per one mole of cesium. Moreover minor amounts of alkali metals other than Cs (Li, Na, K, Rb) and each of alkaline earth metals (Mg, Ca, Sr, Ba) may be present, but as has been shown, in amounts of less than 10 ppm and less than 2 ppm, respectively, in the CsBr:Eu matrix. Each of rare earth elements other than Eu and each of other elements may further be present in same CsBr:Eu matrix in amounts, but in normal conditions, in amounts of less than 20 ppm and less than 10 ppm, respectively.

As a substrate material whereupon the scintillator or phosphor material is deposited in the vapor depositing apparatus of the present invention, use can be made of glass, a ceramic material, a polymeric material or a metal; more preferably a material selected from the group consisting of glass, polyethylene therephthalate, polyethylene naphthalate, polycarbonate, polyimide, aluminum, Pyrex®, polymethylacrylate, polymethylmethacrylate, sapphire, zinc selenide, Zerodur®, a ceramic layer and a metal or an alloy selected from the group of aluminum, steel, brass and copper. It should even not be limited thereto as in principle, any metal or synthetic material resisting irreversible deformation, e.g. as by melting, after addition of energy to the extent as commonly applied in the coating process of the present invention, is suitable for use. Particularly preferred as flexibly moving substrate in method of the present invention is aluminum as a very good heat conducting material allowing a perfect homogeneous temperature over the whole substrate. As particularly useful aluminum substrates, without however being limited thereto, brightened anodized aluminium, anodized aluminium with an aluminium mirror and an oxide package and, optionally, a parylene layer; and anodized aluminium with a silver mirror and an oxide package and, optionally, a parylene layer; available from ALANOD, Germany, are recommended. So as a preferred flexible substrate support an anodized aluminum support layer, covered with a protective foil, is recommended. Such an anodized aluminum support layer may have a thickness in the range of from 50 to 500 µm, and more preferably in the range from 200 to 300 µm. Such an anodized aluminum substrate has shown to be particularly favorable indeed with respect to adhesion characteristics with respect to vapor deposited phosphors or scintillators and even bending of that flexible aluminum support coated with a scintillator layer having a thickness of 500 µm up to 1000 µm, does not cause "cracks" or delamination of scintillator or phosphor "flakes". No problems have indeed been encountered with respect to occurrence of undesirable cracks when prepared in the vapor deposition apparatus of the present invention. Mounting the support preferably proceeds by means of a suction table (30) wherein tension controll on the flexible substrate proceeds by regulating (air) pressure cylinders (31) that push up one roller in case of a configuration with 2 rollers, one (upper) roller present above the other (lower) roller. In said mounting step two ends of the substrate support are glued together with a heat resistant adhesive, with one or more (e.g. a couple of) rivets or with a combination thereof.

In the vapor depositing apparatus of the present invention one carrier roller is rotating, in a controlled way, by means of a motor 10 around its axis, whereas other roller(s) is(are) rotating by movement of said one roller; and wherein while rotating, the position of the flexible substate on the rollers is controlled by means of an optical positioning sensor, coupled back to pressure regulating cylinder(s), providing position adjustment of said flexible substrate. A protective is laminate foil, initially laminated onto said flexible substrate, can be removed in the delamination unit, once said flexible substrate has been put on tension. Said protective laminate foil is then removed under vacuum by delamination, making use of that delamination unit present in the vacuum chamber of the vapor depositing apparatus of the present invention. Said foils are e.g. polymeric foils as e.g. polyethylene foils, polyimide foils and polyester foils, without however being limited thereto.

In the vapor depositing apparatus of the present invention carrier rollers are further thermally isolated from said flexible substrate support by means of a thermal isolation layer and/or a plurality of heat-resistant coiled springs, mounted over the length of the cylinders in such a way that the said coiled springs make an angle in the range of 20° to 40° with a line, parallel with the axis of said cylindrical carrier rollers. More preferably, said coiled springs make an angle in the range of 25° to 35°, and even more preferably an angle of about 30° is envisaged.

The more space is left free in the vacuum chamber of the vapor depositing apparatus of the present invention, the more controll sites are available. Free space can be provided e.g. with heat controlling means and sensors for temperature controll at different sites, with regard to optimize homogeneous vapor deposition onto the moving flexible support. Otherwise, means in order to locally enhance the temperature, by heating as e.g. by infrared radiation, is provided in the vacuum chamber, where free space allows such installation (e.g. in the neighbourhood of the rollers, or whatever a critical site within the vacuum chamber).

While vapor deposition proceeds in the vapor depositing apparatus of the present invention the temperature of the said flexible substrate is maintained in the range from 150° C. to 300° C., more preferably in the range from 150° C. to 250° C. and still more preferably in the range from 180° C. to 220° C., envisaging a target temperature of about 200° C., by means of regulable heaters and by an adressable cooling unit installed along the support. As heaters, infrared heaters are advantageously used. More particularly use is made of large quartz lamps, arranged horizontally, e.g. longitudinally, along the said substrate with a reflecting screen behind it. A vertical arrangement is not excluded however. As additional infrared heaters at least two smaller quartz lamps with a reflecting screen behind are used at the edges of the flexible substrate, in order to reduce temperature differences between the middle and the edges of said substrate. Said additional lamps are advantageously arranged in order to make an angle of about 60° with the large longitudinal quartz lamp. Furtheron a battery of small lamps is advantageously used, as described in an additional experiment in the examples hereinafter.

In the vapor depositing apparatus of the present invention a cooling unit is build up of a black body cooling element, cooled with water at room temperature on the backside, and of an addressable (opened or closed) screen of louvers in form of multiple slats on the front or support side of said cooling element. In one embodiment thereof the said slats are placed with their long side along the moving direction of the support, partly overlapping each other, thereby providing ability to be reflective ("cooling-off") on the front side, and ability to become rotated altogether along their long axis ("cooling-on"). According to the present invention said temperature is measured and registrated and a temperature profile over the whole width of said flexible substrate is used as input for steering substrate heating and/or substrate cooling.

In the vapor depositing apparatus of the present invention temperatures are measured over the whole width of said flexible substrate by means of a set of pyrometers. In one embodiment said pyrometers are lens based pyrometers with a parabolic reflector on top. In a preferred embodiment thereof said reflector is a gold evaporated mirror, wherein each focus of the said parabolic reflector is arranged in order to coincide with each focus of the corresponding pyrometer lens. Means in order to controll layer thickness of deposited material are advantageously installed in order to stop the deposition process when the desired thickness is attained. So in the vapor depositing apparatus of the present invention said sealed zone further comprises as a controlling part a thickness measuring system, determining thickness while vapor depositing said scintillator or phosphor layer, wherein said measuring system is based on capacitance measurements. Furtheron said flexible substrate is spatially surrounded by a reflector cage for heat radiation.

In the lamination unit of the the vapor depositing apparatus of the present invention a protective foil may be provided after depositing said phosphor or scintillator layer. This temporary protection layer may be removed by a delaminating step before or after cutting; or may be a lasting protective foil layer. Lamination steps advantageously make use of the suction table (30), already used before during positioning of the initial substrate web.

In the vapor depositing apparatus of the present invention the delamination unit advantageously makes use of a delamination forerunner (34), mounted by means of one or more rollers (35) to a delamination upwinding roller (33). In another embodiment delamination proceeds by hooking or fastening the said protective laminate foil on the said delamination unit. According to a further aspect said protective foil, provided by the step of laminating said foil after depositing said phosphor or scintillator layer is a lasting protection layer, wherein said lasting protection layer is provided from a protection layer package, comprising a release layer that is removed in a further delaminating step and that is winded up on an upwinding roller.

In the vapor depositing apparatus of the present invention the protective foil, provided by the step of laminating said foil after depositing said phosphor or scintillator layer is a lasting protection layer, wherein said lasting protection layer is provided from a protection layer package, comprising a release layer removed in a further delaminating step by means of the same delaminating unit used during the delaminating step of said flexible substrate, when initially provided with a protective laminate foil. Such a protection layer in the lamination package is advantageously consisting of polymer layer with an adhesive layer at one side, and a release layer at the other side. Preferred release layers, also called release liners, are e.g. siliconized polyethylene terephthalate release layers, in contact with an adhesive layer, whereas the protection foil is a polymer foil as, e.g. a polyethylene foil, a polyester foil or a polyimide foil, without however being limited thereto. The lamination package advantageously passes the laminate unit (36) with mechanism for supplying laminate foil and the protective foil is delaminated from the release layer in order to become laminated onto the vapor deposited phosphor layer. As this operation advantageously proceeds in vacuum the phosphor layer remains free from dust and dirt, corresponding with the objects of the present invention. The release layer is further guided over the guiding rollers (45) to the same delamination collecting roller as has been available for delamination of the initial laminate present on the protected substrate support. It is clear that more particularly presence of an initial laminate on the substrate support is envisaged in order to fully reach the objects of the present invention. So advantage is obtained by starting with e.g. a polyethylene protected anodized aluminum substrate support, without however limiting it thereto.

Cutting said flexible substrate, coated with a phosphor or scintillator layer into sheets or panels having desired formats, proceeds out of the vacuum chamber of the vapor depositing apparatus of the present invention.

In a common arrangement within the sealed zone under vacuum pressure (vacuum conditions corresponding with at least $10^{-1}$ mbar, and even down to $10^{-4}$ mbar or less if attainable as in the preferred configuration of the coating apparatus), in the vapor depositing apparatus of the present invention, the container is one crucible, preferably as described hereinbefore and as illustrated in FIG. 2. It is not excluded to make use of a plurality of crucibles, arranged in each direction of the two-dimensional, coated surface. Moreover it is recommended to make use of advantageous measures taken into account with respect to crucibles as described in EP-Applications Nos. 03 102 003 and 03 120 004, both filed Jul. 4, 2003.

It is evident that the composition of the raw material in the container(s) (crucible(s)) of the vapor depositing apparatus of the present invention is chosen in order to provide an end composition or coating composition as desired, wherein said composition is determined by the ratios of raw materials present. Ratios of raw materials are chosen in order to provide the desired chemical phosphor or scintillator composition after deposition of the vaporized raw materials. It is desirable to mix the raw materials in order to get a homogeneous raw mix in the crucible(s) in form of solid powders, grains or granules, or as pastilles having a composition corresponding with the desired ratios of raw materials in order to provide the desired phosphor coated onto the moving substrate material. A milling procedure may be favorable in order to provide a high degree of homogeneity before vaporization and is therefore recommended. Differing components may also be vaporized from different crucibles, arranged in series or in parallel or in a combined arrangement as already suggested before, provided that a homogeneous vapor cloud is presented to the flexible substrate via the vapor stream or flow, deposited by condensation onto said substrate. Two elongated one-part boats having same or different raw material content or raw material mixtures may e.g. be present in series in the moving direction of the web. In another embodiment, if providing a more homogeneous coating profile, boats may be arranged in parallel on one axis or more axes, perpendicular to the moving direction of the support, provided that overlapping evaporation clouds again are providing a vapor stream that becomes deposited onto the support in a phosphor or scintillator layer having a homogeneous thickness, composition and coated amount of said phosphor or scintillator. Presence of more than one crucible may be in favor of ability to supply greater amounts of phosphor or scintillator material to be deposited per time unit, the more when the flexible substrate should pass the vapor flow at a rate, high enough in order to avoid too high temperature increase of the substrate. The velocity or rate at which the substrate passes the container(s) should indeed not be too slow in view of undesired local heating of the substrate support, making deposition impossible, unless sufficient cooling means are present in favor of condensation. The supporting or supported substrate should therefore preferably have a temperature between 50° C. and 300° C. in order to obtain deposited phosphor or scintillator layers having the desired optimized properties.

It is clear that energy should be supplied to one or more container(s), also known as crucible(s), tray(s) or boat(s), in order to provoke a vapor flow (or stream) of the raw materials present therein, which become vaporized in the sealed vacuum zone: energy is submitted thereto by thermal, electric, or electromagnetic energy sources. As an example of an electromagnetic energy source a diode, a cathodic arc, a laser beam, an electron beam, an ion beam, magnetron radiation or radio frequencies may be used, whether or not pulsed, without however being limited thereto. Electric energy is commonly provided by resistive heating, making use of resistance coils wound is around the container(s) or crucible(s) in a configuration in order to get conversion into thermal energy, thereby providing heat transfer to the containers or crucibles filled with the raw materials that should be evaporated. Energy supply to an extent in order to heat the container(s) or crucible(s) up to a temperature in the range from 550–900° C. is highly desired. At those temperatures, it containers should resist corrosion, so that refractory containers are preferred. Preferred container or crucible materials therefor are tungsten, tantalum, molybdenum and other suitable refractory metals. Energy supply as set forth heats the mixture of raw materials in the crucible to a temperature above 450° C., preferably above 550° C., and even more preferably in the range of 550° C. up to 900° C., e.g. at about 700° C.

A cloud of vaporized material, originating from the target raw materials thus escapes as a cloud in form of a flow or stream from the container(s) or crucible(s) in the direction of the moving substrate, where a coated layer is formed by condensation. From the description above it is clear that, in order to obtain a homogeneous coating profile as envisaged, a homogeneous cloud can only be realized when homogeneity is provided in the bulk of the liquefied raw material. As a consequence, a homogeneous distribution of energy supplied over the container is a stringent demand. In a preferred embodiment, in favor of homogeneity, the crucible is in form of a single elongated "boat" with a largest dimension corresponding with the width of the flexible support moving over the said crucible so that at each point of its surface area the momentarily velocity magnitude is constant. If required during or after the deposition process oxygen can be introduced into the vacuum deposition chamber in form of oxygen gas via the argon gas inlet (42). More particularly an annealing step inbetween two deposition steps or at the end of the phosphor deposition may be beneficial.

An important factor with respect to coating profile, to be obtained on the substrate support in the vapor depositing apparatus of the present invention, is the distance between container(s) and moving substrate as the distance determines the profile of the vapor cloud at the position of the flexible substrate. Average values of shortest distances between crucible(s) and substrate are preferably in the range of from 5 to 10 cm. Too large distances would lead to loss of material and decreased yield of the process, whereas too small distances would lead to too high a temperature of the substrate. Moreover care should further be taken with respect to avoiding "spot errors" or "pits", resulting in uneven deposit of phosphors or scintillators, due to spitting of the liquefied raw materials present in the heated container(s). Measures taken therefore have been illustrated in FIG. 1 and, more in detail in FIG. 2, more particularly with lamps used as baffles, and more preferably with three linear chimney heating elements, mounted versus the slot outlet and positioned so that there is no direct path for vaporized particles from said raw materials to escape through said slot outlet. Other applicable measures are those described in EP-Applications Nos. 03 102 003 and 03 102 004, both filed Jul. 4, 2003.

In the vapor depositing apparatus of the present invention vapor deposition of said phosphor or scintillator compositions is initiated by a vapor flow of raw materials from one or more crucible(s), wherein said vapor flow is generated by adding energy to said raw materials and said container(s), by thermal, electric, or electromagnetic energy or a combination thereof. So vapor depositing said phosphor or scintillator compositions advantageously proceeds by physical vapor deposition, by chemical vapor deposition or a by combination of physical and chemical vapor deposition.

With respect to the coated phosphor to be obtained in the vapor depositing apparatus of the present invention said phosphor, in one embodiment, is a photostimulable phosphor. A very interesting photostimulable (storage) phosphor that is successfully deposited in the vapor depositing apparatus of the present invention is a CsBr:Eu phosphor. Raw materials used in the preparation of CsBr:Eu storage phosphor plates or panels are CsBr and between $10^{-3}$ and 5 mol % of a Europium compound selected from the group consisting of $EuX'_2$, $EuX'_3$ and $EuOX'$, X' being a halide selected from the group consisting of F, Cl, Br and I as has been used in the preparation method disclosed in PCT-filing WO 01/03156. Even more preferred is a binderless coating of the selected CsBr:Eu phosphor from CsBr and EuOBr raw materials, wherein the said phosphor is characterized by its particular needle-shaped form. The high degree of crystallinity is easily analysed by X-ray diffraction techniques, providing a particular XRD-spectrum as has been illustrated in EP-A 1 113 458. Therefore a mixture of CsBr and EuOBr is provided as a raw material mixture in the crucibles, wherein a ratio between both raw materials normally is about 90% by weight of the cheap CsBr and 10% of the expensive EuOBr, both expressed as weight %. It has however been shown that as a function of coating (evaporating) temperature ratios can be adapted in favor of lower material and production cost, without resulting in changes in composition: so higher vaporization temperatures for the raw material mixture in ratio amounts of 99.5 wt % CsBr and 0.5 wt % EuOBr provide the same result as before.

The preferred $CsBr:Eu^{2+}$ phosphor, obtained after vapor deposition as a needle-shaped phosphor in the vapor depositing apparatus of the present invention, is characterized by voids between the needles. In order to fill those voids, measures can be taken as described in EP-A 1 347 460, wherein voids are partially filled with a polymeric compound; as in EP-A 1 349 177, wherein vapor deposited pigments like the preferred β-Cu-phthalocyanine nanocrystalline dye compound are filling said voids or as in EP-Application No. 03 100 471, filed Feb. 26, 2003, wherein the voids are at least partially filled with polymeric compounds selected from the group consisting of silazane and siloxazane type polymeric compounds, mixtures thereof and mixtures of said silazane or siloxazane type polymeric compounds with compatible polymeric compounds. More particularly with respect to the said dyes or pigments, vapor deposition thereof can be performed in the vacuum deposition chamber used in the configuration of the production method according to the present invention.

In order to prepare sheets or panel provided with the preferred $CsBr:Eu^{2+}$ phosphor, the vapor depositing apparatus of the present invention starts with mixed raw materials in the crucible(s) comprising, as phosphor precursors, at least $Cs_xEu_yX'_{x+\alpha y}$, wherein the ratio of x to y exceeds a value of 0.25, wherein $\alpha \geq 2$ and wherein X' is a halide selected from the group consisting of Cl, Br and I and combinations thereof.

In another embodiment said mixture of raw materials comprises, as phosphor precursors, at least CsBr and $Cs_xEu_yX'_{x+\alpha y}$, wherein the ratio of x to y exceeds a value of 0.25, wherein $\alpha \geq 2$ and wherein X' is a halide selected from the group consisting of Cl, Br and I and combinations thereof. Methods for preparing and coating desired CsBr:Eu phosphors, wherein use is made of precursors as set forth, have been described in EP-Applications Nos. 04 100 675 and 04 100 678 respectively, both filed Feb. 20, 2004.

At the moment of deposition, a preferred stimulable phosphor or scintillator layer, prepared in the vapor depositing apparatus of the present invention, is a binderless layer. This can be well understood, as at those high temperatures, presence of additional binders besides phosphors or scintillators raw materials in the container(s) would not be practical. It is however not excluded to make use of polymers, showing ability to become vaporized, in order to serve as binder material e.g. between substrate and phosphor or scintillator layer or even between the preferred phosphor or scintillator needles in the coated layer. Moreover when laminating a polymer layer onto the deposited layer, it is not excluded that polymer material is filling, at least in part, the voids between those needles. Furtheron it is not excluded to provide the phosphor or scintillator sheets or panels, before or after cutting in desired formats, with a moisture-resistant layer, in order to protect the moisture-sensitive phosphor layer against deterioration. Particularly preferred layers are e.g. parylene (p-xylylene) layers as described in EP-A 1 286 364, whether or not overcoated with a transparent organic layer of silazane or siloxazane type polymeric compounds or mixtures thereof as described in EP-Application No. 03 100 472, filed Feb. 26, 2003. In the method of applying a protecting parylene layer to phosphor or scintillator coatings as a "parylene layer" a halogen-containing layer was preferred. More preferably said "parylene layer" is selected from the group consisting of a parylene D, a parylene C and a parylene HT layer. In the particular case a cross-linked polymeric layer is advantageously formed on a phosphor screen material, wherein the said polymeric material layer has been formed by reaction of at least one component, thereby forming self-condensing polymers. Reactive monomers are provided in form of heated vapor in order to form the desired condensation polymer on the substrate, wherein said condensation polymer is in form of a p-xylylene or "parylene" layer on the phosphor screen substrate. Examples of these "parylene" layers are poly-p-xylylene (Parylene-N), poly-monochloro-p-xylylene (Parylene-C) and poly-dichloro-p-xylylene (Parylene-D). If desired a pigment can be integrated into a thin film of a poly-p-xylylene as has been described in JP-A 62-135520.

Apart from a stimulable phosphor layer, a prompt emitting luminescent phosphor can be coated in the vapor depositing apparatus of the present invention. Such a luminescent phosphor is suitable for use e.g. in intensifying screens as used in screen/film radiography.

With respect to the specific application, related with CR and DR, it is clear that in view of image quality, and more particularly in view of sharpness, binderless phosphor or scintillator layers as described hereinbefore are preferred. With respect thereto it is clear that vaporization of raw materials in the vapor depositing apparatus of the present invention, in order to build the desired scintillator or phosphor layers is a preferred technique, provided that, according to the present invention the layers have been deposited on a flexible substrate, wherein it is envisaged to deform the flexible support in order to get a flat sheet or panel, ready-for-use, suited for specific CR and DR applications. Other hygroscopic phosphor or scintillator layers besides the preferred CsBr:Eu phosphor that are advantageously prepared according to the method of the present invention are e.g. BaFCl:Eu, BaFBr:Eu and GdOBr:Tm, used in intensifying screens; CsI:Na applied in scintillator panels and storage phosphors suitable for use in computed radiography (CR) as e.g. BaFBr:Eu, BaFI:Eu, (Ba,Sr)F(Br,I):Eu, RbBr:Tl, CsBr: Eu, CsCl:Eu and RbBr:Eu; or CsI:Tl, $Lu_2O_2S$:xM and $Lu_2O_5Si$:xM, wherein M is selected from the group of rare earth elements consisting of Eu, Pr and Sm and wherein x is from 0.0001 to 0.2, which is particularly suitable for use in DR-cassettes as disclosed in EP-Applications Nos. 04 102 984 and 04 102 985 respectively, both filed Jun. 28, 2004.

While the present invention will hereinafter be described in connection with preferred embodiments thereof, it will be understood that it is not intended to limit the invention to those embodiments.

EXAMPLES

Example 1

A CsBr:Eu photostimulable phosphor screen having a flexible anodized aluminum was prepared in a vacuum chamber by means of a thermal vapor deposition process, starting from a mixture of CsBr and EuOBr as raw materials. Said deposition process onto said flexible anodized aluminum support was performed in such a way that said support was moving so that the momentary magnitude of the velocity was constant over its whole area.

Referring to FIG. 2 the cylindrical vacuum chamber (1) with a diameter of 1.4 m and a length of 1.75 m was containing an electrically heated oven (2) and a refractory tray or boat (3) in which 4 kg of a mixture (4) of CsBr and EuOBr as raw materials in a 99.5%/0.5% CsBr/EuOBr percentage ratio by weight were present to become vaporized.

Crucible (3) was an elongated boat having a length of 1 m and a width of 4 cm composed of "tantalum" having a thickness of 0.5 mm, composed of 3 integrated parts: a crucible container (25), an internally heated chimney (26) and a controllable outlet (27. The longitudinal parts are folded from one continuous tantalum base plate in order to overcome leakage and the head parts are welded. The chimney was provided with 3 linear IR quartz heaters width a diameter of 11 mm (28) in order to heat the chimney in order to overcome condensation of vaporized materials. Moreover the chimney heaters (28) were positioned in a baffled way in order to overcome spatter of molten or vaporized material onto the substrate into an uncontrolled and unlimited way. A lip opening of 5 mm as controllable outlet (27) was used. A heat shield (41) with slit opening was further shielding heat in order to avoid escape of heat and loss of energy, required to provoke vapor escape and deposit onto the continuously moving substrate support in a controlled and uniform way.

Under vacuum pressure (a pressure of $2 \times 10^{-1}$ Pa equivalent with $2 \times 10^{-3}$ mbar) maintained by a continuous inlet (42) of argon gas into the vacuum chamber (1), and at a sufficiently high temperature of the vapor source (760° C.) and the chimney (26) the obtained vapor was directed towards the moving sheet support (5) and was deposited thereupon successively while said support was moving along the vapor stream (16). Said temperature of the vapor source was measured by means of thermocouples (43) present outside and pressed under the bottom of said crucible and tantalum protected thermocouples (44) present in the crucible and in the chimney (26).

The anodized aluminum substrate support (5) having a thickness of 280 μm, a width of 1.18 m and a length of 2.50 m, together with a protection foil (29) was mounted onto the anodized side around two cylindrical support rollers (6) and (20), both having a diameter of 40 cm and a length of 1.18 m. The said anodized side was positioned at the side whereupon the phosphor should be deposited. The support (5) was correctly positioned by means of the suction table (30) that was present in the machine. While positioning it is not required to work under vacuum conditions, but optionally use can be made thereof. The two ends of the support were glued together with a heat resistant adhesive and with a couple of rivets. The tension on the support was further controlled by regulating the pressure on two cylinders that push up the upper support roller (20). Such a system moreover avoids or compensates for a loss of tension during heating up the anodized aluminum support, due to thermal expansion of the support. The lower roller (6) was rotating in a controlled way by means of a motor around its axis, whereas the upper roller was rotating by means of the support, moving by the rotating lower roller (6). Under vacuum, during rotation, the position of the support on the rollers could be controlled by means of an optical positioning sensor (32) (placed in vacuum), coupled back to pressure regulating cylinder(s) (31) provided for pushing up the upper carrier roller (20). The anodized aluminum was moving with a constant linear velocity of 20 m per minute.

The lower cylindrical carrier roller (6) and the upper carrier roller (20) were thermally isolated from the substrate support sheet (5) by means of a thermal isolation layer (7) and by means of heat-resistant coiled springs (8), that were mounted over the length of the cylinder in such a way that the coiled springs make an angle of 30° with a line, parallel with the axis of the cylinder.

The protection foil for the aluminum was removed once the support was on tension.

The temperature of the support (5) was maintained in the vicinity of 200° C. (±10° C.). The temperature was measured over the whole width of the roller with 5 pyrometers. In order to overcome misleading temperature measurements due to failures by measuring of heating effects by reflection of environmental heat radiation, use was made of lens based pyrometers with a parabolic reflector on top (38). In order to obtain a good reflection in the reflector a gold evaporated mirror was used. The focus of the parabolic reflector was directed in order to coincide with the focus of the pyrometer lens. The temperature of the substrate was regulated by means of regulable infrared heater(s) (9) and by an adressable cooling unit (39) installed along the support. As infrared heaters (9) used was made of quarts lamps. Those lamps were always addressed at full power in order to provide energy emission within a wavelength spectrum, matching the absorption spectrum of the aluminum substrate support. The effective heat radiation time was regulated by 7 pulse levels and the amount of radiation was determining regulation of the "on" and the "off" term of the lamps. Those lamps were placed horizontally along the support with a reflecting screen behind it. In addition two small quartz lamps with a reflecting screens behind it, were used at the edges, in order to reduce temperature differences between the middle and the edges of the plate. These lamps were arranged in such a way that an angle was made of 60° with the large longitudinal quartz lamp.

In order to provide efficient heating, the support was surrounded by a reflector cage (10) for reventing loss of heat radiation. That reflector cage (10) was made of reflecting material (aluminum in this case), taking into account spatial limitations and bypassing obstacles as much as possible.

In order to overcome excessive temperature increase while depositing vaporized phosphor or scintillator material, the substrate was cooled, by means of an adressable cooling unit (39), installed along and over the full width of the support. The cooling unit was addressable as it could be made effective or not by "switching" in an "on" or "off" position. Therefore it was build up of a black body cooling element, cooled with water at room temperature on the backside, and of an addressable (opened, closed) screen of louvers (multiple slats) on the front or support side. The slats were placed with their long side along the moving direction of the support, partly overlapping each other, providing ability to be reflective on the front side, and ability to become rotated altogether along their long axis. In the "cooling-off" position ("closed" position) the reflecting surface of the slats were directed towards the support in order to keep the heat preserved in the support, whereas in the "cooling-on" position the slats were rotated altogether over 90° in order to open the screen, so that the cool black body behind the screen could provide cooling of the support.

A CsBr:Eu stimulable phosphor layer having an average thickness of 400 µm was, within a time of 45 minutes, deposited over the entire length of the support in successive steps, during which the thickness of the deposited layer was increasing. Each site of the support was successively passing more times the vapor stream over the refractory boat or tray. The layer was thereby growing with an increasing thickness per each rotation, wherein said increasing thickness was measured on-line by a thickness measuring apparatus (22), based on capacitance measurements: changes in capacitance were introduced by the growing phosphor layer, measured between 2 electrodes (one of which, connected with the upper carrier roll was set on ground potential). As a result, in order to give an idea about homogeneity of the deposited layer onto the support, a variety in thicknesses in the range between 594 µm and 691 µm was obtained over the whole width thereof.

The stimulable phosphor layer was showing a blue luminescence under UV radiation again.

Panels having the desired size, as e.g. 35 cm×45 cm, were cut out of the above described large plate with a good edge quality. The cutted panels were then laminated against a rigid flat glass plate without damage of the layer, making use therefor of a transferable adhesive.

Having described in detail preferred embodiments of the current invention, it will now be apparent to those skilled in the art that numerous modifications can be made therein without departing from the scope of the invention as defined in the appending claims.

PARTS LIST (1) vacuum chamber
(2) oven
(3) crucible, tray or boat
(4) mixture of raw materials
(5) sheet
(6) conveying carrier roller
(7) thermal isolation layer
(8) cylindrical springs
(9) infrared heater
(10) reflector cage
(11) pyrometer
(12) baffle
(13) baffle
(14) metallic raster
(15) separation plates
(16) vapor stream
(17) baffle
(18) evaporation part
(19) heating part
(20) upper conveying carrier roller
(21) travelling pathway
(22) thickness measuring system
(23) unwinding roller (supplying laminate roller)
(24) upwinding roller (collecting initial laminated protective foil on substrate)
(25) crucible container
(26) internally heated chimney
(27) controllable slot outlet
(28) chimney heaters
(29) initial delaminated protection foil
(30) (optionally vacuum) suction table

(31) pressure regulating cylinder(s)
(32) optical positioning sensor
(33) delamination collecting roller for delaminate foil (for initial laminate on substrate, and, optionally for release layer of lamination package for laminating deposited phosphor or scintillator layer)
(34) delamination forerunner
(35) delamination rollers
(36) lamination unit to apply protection foil after vapor deposition
(37) protection foil to be laminated after vapor deposition step
(38) pyrometers
(39) cooling unit
(40) heating system
(41) heat shield with slit
(42) gas inlet
(43) thermocouples
(44) protected thermocouples
(45) guiding rollers
(46) laminate release foil (optional)
(47) chimney inlet ■

The invention claimed is:

1. A vapor deposition apparatus comprising
a) a crucible containing a mixture of raw materials;
b) a chimney having at least one inlet in communication with said crucible and a linear slot outlet, having a width W and a length L;
c) more than one linear heating elements, contained within said chimney;
d) an oven surrounding the crucible, containing heating elements, shielding elements and cooling elements; and
further having at least two cylindrical carrier rollers within a sealed zone, wherein each of said carrier rollers have an axis in a parallel arrangement with one another wherein said zone further comprises a laminating unit.

2. Vapor deposition apparatus according to claim 1, wherein said zone further comprises a delaminating unit.

3. A vapor deposition apparatus comprising
a) a crucible containing a mixture of raw materials;
b) a chimney having at least one inlet in communication with said crucible and a linear slot outlet, having a width W and a length L;
c) more than one linear heating elements, contained within said chimney;
d) an oven surrounding the crucible, containing heating elements, shielding elements and cooling elements; and
further having at least two cylindrical carrier rollers within a sealed zone, wherein each of said carrier rollers have an axis in a parallel arrangement with one another and wherein said zone further comprises more than one crucible containing a mixture of raw materials wherein said zone further comprises a laminating unit.

4. Vapor deposition apparatus according to claim 3, wherein said zone further comprises a delaminating unit.

5. A vapor deposition apparatus comprising
a) a crucible containing a mixture of raw materials;
b) a chimney having at least one inlet in communication with said crucible and a linear slot outlet, having a width W and a length L;
c) more than one linear heating elements, contained within said chimney;
d) an oven surrounding the crucible, containing heating elements, shielding elements and cooling elements; and
further having at least two cylindrical carrier rollers within a sealed zone, wherein each of said carrier rollers have an axis in a parallel arrangement with one another wherein said zone further comprises a delaminating unit.

6. A vapor deposition apparatus comprising
a) a crucible containing a mixture of raw materials;
b) a chimney having at least one inlet in communication with said crucible and a linear slot outlet, having a width W and a length L;
c) more than one linear heating elements, contained within said chimney;
d) an oven surrounding the crucible, containing heating elements, shielding elements and cooling elements; and
further having at least two cylindrical carrier rollers within a sealed zone, wherein each of said carrier rollers have an axis in a parallel arrangement with one another and wherein said zone further comprises more than one crucible containing a mixture of raw materials wherein said zone further comprises a delaminating unit.

7. A vapor deposition apparatus comprising
a) a crucible containing a mixture of raw materials;
b) a chimney having at least one inlet in communication with said crucible and a linear slot outlet, having a width W and a length L;
c) more than one linear heating elements, contained within said chimney;
d) an oven surrounding the crucible, containing heating elements, shielding elements and cooling elements; and
further having at least two cylindrical carrier rollers within a sealed zone, wherein each of said carrier rollers have an axis in a parallel arrangement with one another wherein one carrier roller is rotating, in a controlled way, by means of a motor around its axis, whereas other roller(s) is(are) rotating by movement of said one roller; and wherein while rotating, the position of the flexible substate on the rollers is controlled by means of an optical positioning sensor, coupled back to pressure regulating cylinder(s), providing position adjustment of said flexible substrate.

8. A vapor deposition apparatus comprising
a) a crucible containing a mixture of raw materials;
b) a chimney having at least one inlet in communication with said crucible and a linear slot outlet, having a width W and a length L;
c) more than one linear heating elements, contained within said chimney;
d) an oven surrounding the crucible, containing heating elements, shielding elements and cooling elements; and
further having at least two cylindrical carrier rollers within a sealed zone , wherein each of said carrier rollers have an axis in a parallel arrangement with one another wherein said carrier rollers are thermally isolated from said flexible substrate support by means of a thermal isolation layer and/or a plurality of heat-resistant coiled springs, mounted over the length of the cylinders in such a way that said coiled springs make an angle in the range of 20° to 40° with a line, parallel with the axis of said cylindrical carrier rollers.

9. A vapor deposition apparatus comprising
a) a crucible containing a mixture of raw materials;
b) a chimney having at least one inlet in communication with said crucible and a linear slot outlet, having a width W and a length L;
c) more than one linear heating elements, contained within said chimney;

d) an oven surrounding the crucible, containing heating elements, shielding elements and cooling elements; and further having at least two cylindrical carrier rollers within a sealed zone, wherein each of said carrier rollers have an axis in a parallel arrangement with one another wherein said apparatus further comprises regulable heaters and an addressable cooling unit installed along said cylindrical carrier rollers wherein said cooling unit comprises a black body cooling element, cooled with water at room temperature on the backside, and of an addressable (opened or closed) screen of louvers in form of multiple slats on the front or support side of said cooling element.

10. A vapor deposition apparatus comprising a) a crucible containing a mixture of raw materials;

b) a chimney having at least one inlet in communication with said crucible and a linear slot outlet, having a width W and a length L;

c) more than one linear heating elements, contained within said chimney;

d) an oven surrounding the crucible, containing heating elements, shielding elements and cooling elements; and further having at least two cylindrical carrier rollers within a sealed zone, wherein each of said carrier rollers have an axis in a parallel arrangement with one another wherein a set of pyrometers is mounted over the whole width of said cylindrical carrier rollers.

11. A vapor deposition apparatus comprising a) a crucible containing a mixture of raw materials;

b) a chimney having at least one inlet in communication with said crucible and a linear slot outlet, having a width W and a length L;

c) more than one linear heating elements, contained within said chimney;

d) an oven surrounding the crucible, containing heating elements, shielding elements and cooling elements; and further having at least two cylindrical carrier rollers within a sealed zone, wherein each of said carrier rollers have an axis in a parallel arrangement with one another wherein the said cylindrical carrier rollers are spatially surrounded by a reflector cage providing heat radiation.

* * * * *